(12) United States Patent
Chang et al.

(10) Patent No.: US 8,022,434 B2
(45) Date of Patent: Sep. 20, 2011

(54) LIGHT-EMITTING DIODE

(75) Inventors: Wei Chang, San Chung (TW);
Shih-Chao Shen, San Chung (TW)

(73) Assignee: Unity Opto Technology Co., Ltd., Taipei Hsien (TW)

( * ) Notice: Subject to any disclaimer, the term of this patent is extended or adjusted under 35 U.S.C. 154(b) by 158 days.

(21) Appl. No.: 12/453,800

(22) Filed: May 22, 2009

(65) Prior Publication Data

US 2010/0295072 A1    Nov. 25, 2010

(51) Int. Cl.
*H01L 33/00* (2010.01)
(52) U.S. Cl. .................................. 257/99; 257/E33.073
(58) Field of Classification Search .................. 257/98, 257/E33.058, E33.078, 99, E33.073, E33.068
See application file for complete search history.

(56) References Cited

FOREIGN PATENT DOCUMENTS

JP    2007-80879    *  3/2007

* cited by examiner

*Primary Examiner* — Thomas L Dickey
*Assistant Examiner* — Fazli Erdem
(74) *Attorney, Agent, or Firm* — Rosenberg, Klein & Lee

(57) ABSTRACT

Disclosed is an improved light-emitting diode, which can be a PLCC or SMD type light-emitting diode. The light-emitting diode includes a package body, at least one pair of conductive terminals, and an optic lens. The package body has an end surface, a circumferential surface extending from the end surface, and a receptacle for accommodating a light-emitting chip. The pair of conductive terminals is fixed to the package body. The optic lens covers the end surface of the package body and is even expanded to cover the circumferential surface of the package body. In this way, effects of improved bonding strength, improved optic advantages, being easy to adjust to a desired angle with the optic lens, and alleviation of troubles caused by overflow of adhesive can be realized.

6 Claims, 4 Drawing Sheets

LIGHT-EMITTING DIODE

FIELD OF THE INVENTION

The present invention relates to an improved light-emitting diode, and in particular to a PLCC (Plastic Leaded Chip Carrier) or SMD (Surface Mount Device) type light-emitting diode, which improves bonding between an optic lens and a package body.

BACKGROUND OF THE INVENTION

Light-emitting diodes of PLCC or SMD type suffer the following disadvantages.

With reference to FIG. 1 of the attached drawings, which shows a cross-sectional view of a conventional light-emitting diode, the conventional light-emitting diode, generally designated at 1, comprises a package body 11, a pair of conductive terminals 12 that is fixed to the package body, and an optic lens 13 formed on the package body. The package body 11 has an end surface 14, a circumferential surface 112 extending from the end surface 14, and a receptacle 111 receiving therein a light-emitting chip 15. As shown in the drawing, the optic lens 13 of the conventional light-emitting diode is only bonded to a central portion of the end surface 14 and therefore, the optic lens 13 and the package body 11 do not show sufficient bonding strength therebetween. Further, since the optic lens 13 is only bonded to the central portion of the end surface 14, the optic lens 13 is apparently of a diameter that is smaller than that of the package body 11, and this leads to poor optic performance of the conventional light-emitting diode 1. Further, since the optic lens 13 is only of a small diameter, it would be difficult to make angle adjustment through the optic lens 13. In addition, in coupling the optic lens 13 of the conventional light-emitting diode to the package body 11, in case that the diameter of the optic lens 13 is inadvertently made slightly enlarged, it often cause undesired overflow of bonding adhesive between the optic lens 13 and the package body 11. The excessive bonding adhesive may flow along the circumferential surface 112 of the package body 11 to stain the conductive terminals 12. Staining of adhesive on the conductive terminals 12 may cause troubles in application of tin, leading to poor performance of SMT (Surface Mount Technology) operation.

Thus, the present invention aims to provide an improved light-emitting diode that overcomes the above discussed drawbacks of the known light-emitting diodes.

SUMMARY OF THE INVENTION

An objective of the present invention is to provide an improved light-emitting diode, which the bonding between an optic lens and a package body is extended to a circumferential surface of the package so that the effects of improved bonding strength, improved optic advantages, being easy to adjust to a desired angle with the optic lens, and alleviation of troubles caused by overflow of adhesive can be realized.

Another objective of the present invention is to provide an improved light-emitting diode, which comprises first and second interference portions respectively formed on a circumferential surface of a package body and a corresponding location on an optic lens to provide an effect of improving bonding strength.

To realize the above objectives, the present invention provides an improved light-emitting diode, which comprises a package body, at least one pair of conductive terminals, and an optic lens. The package body has an end surface, a circumferential surface extending from the end surface, and a receptacle for accommodating a light-emitting chip. The pair of conductive terminals is fixed to the package body. The optic lens covers the end surface of the package body and is even expanded to cover the circumferential surface of the package body.

As such, the improved light-emitting diode in accordance with the present invention offers the effects of improving bonding strength, improving optic advantages, being easy to adjust to a desired angle with the optic lens, and alleviating troubles caused by overflow of adhesive.

Preferably, the package body comprises at least one first interference portion circumferentially formed on the circumferential surface thereof, and the optic lens comprises at least one second interference portion circumferentially formed thereon at a location adjacent to the circumferential surface. The second interference portion corresponds to the first interference portion. The first and second interference portions are interferentially engageable with each other.

BRIEF DESCRIPTION OF THE DRAWINGS

The present invention will be apparent to those skilled in the art by reading the following description of preferred embodiments thereof with reference to the drawings, in which.

DETAILED DESCRIPTION OF THE PREFERRED EMBODIMENTS

Figure 1:
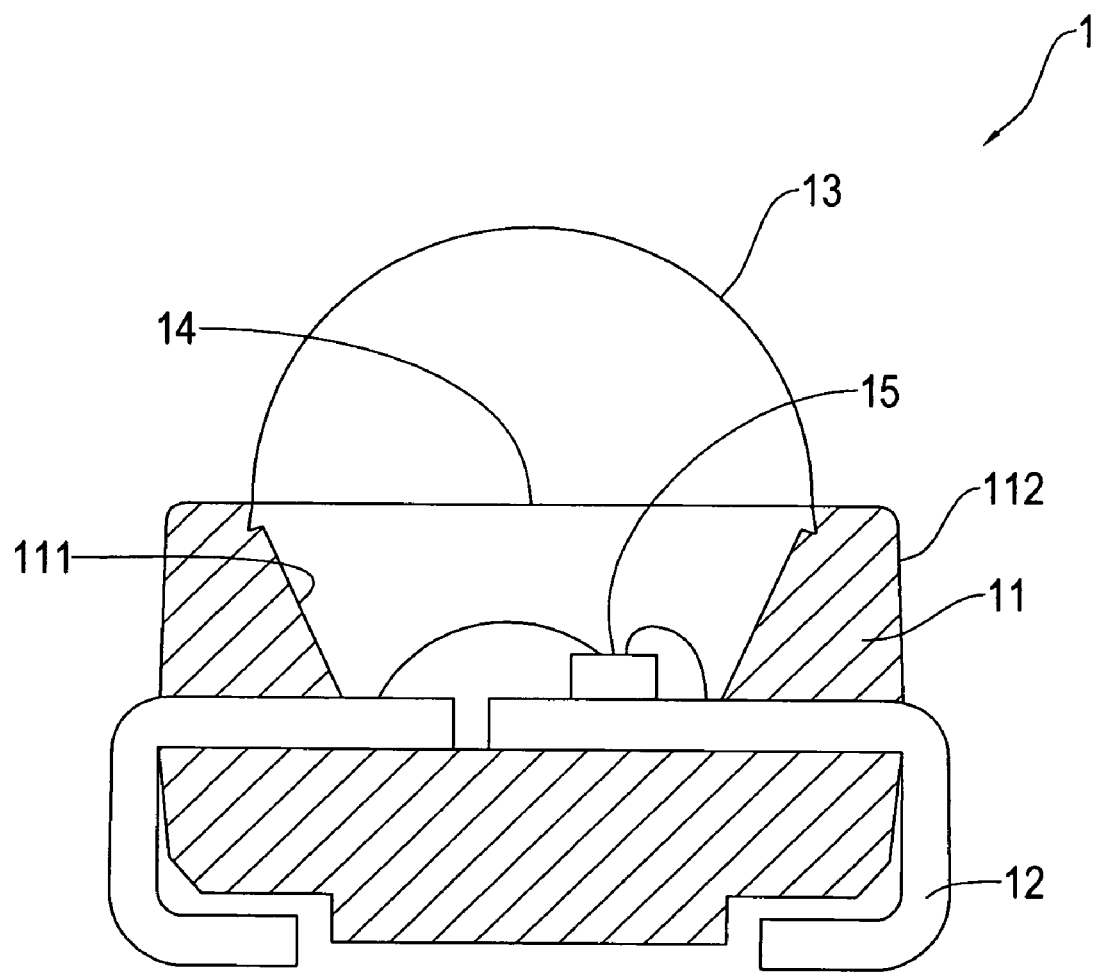
FIG. 1 is a cross-sectional view of a conventional light-emitting diode.
Figure 2:
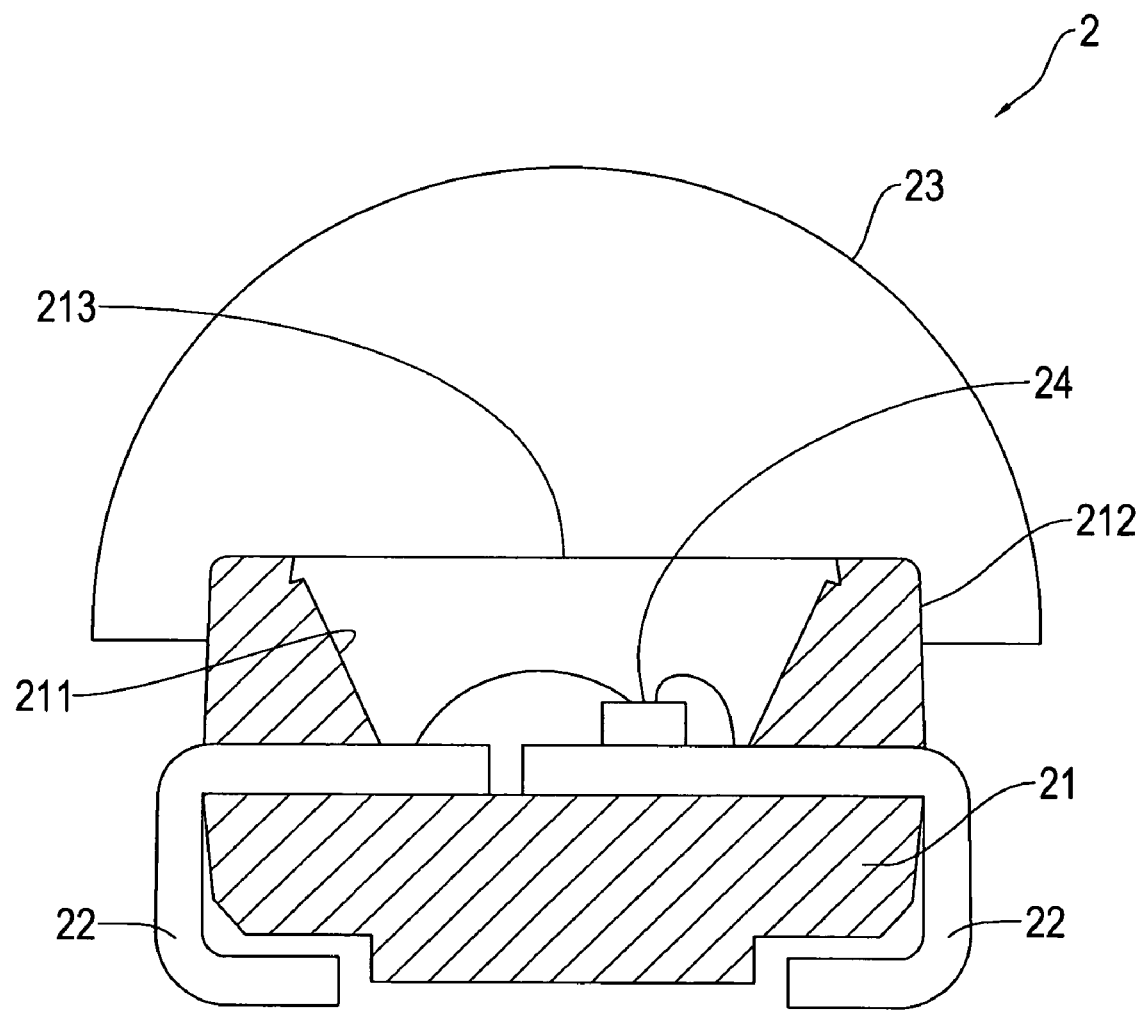
FIG. 2 is a cross-sectional view of a light-emitting diode in accordance with a first embodiment of the present invention.
Figure 3:
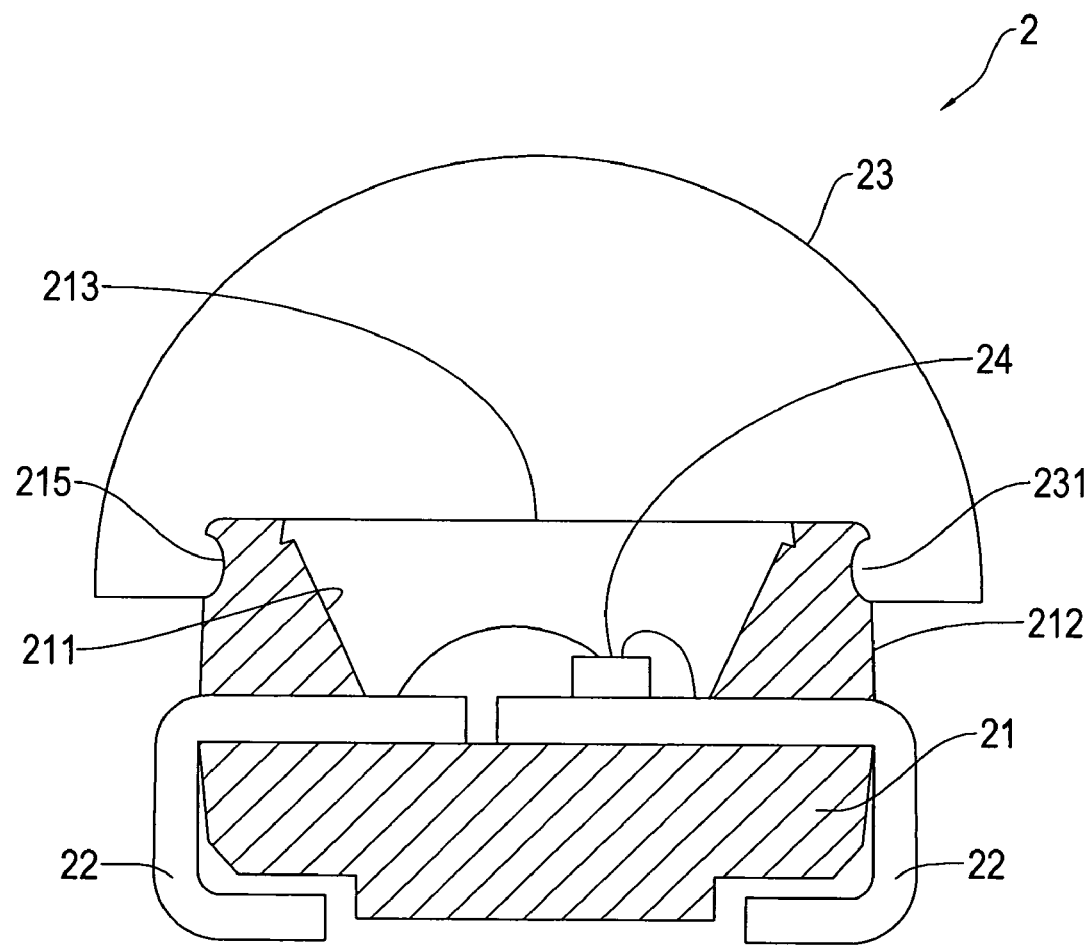
FIG. 3 is a cross-sectional view of a light-emitting diode in accordance with a second embodiment of the present invention.
Figure 4:
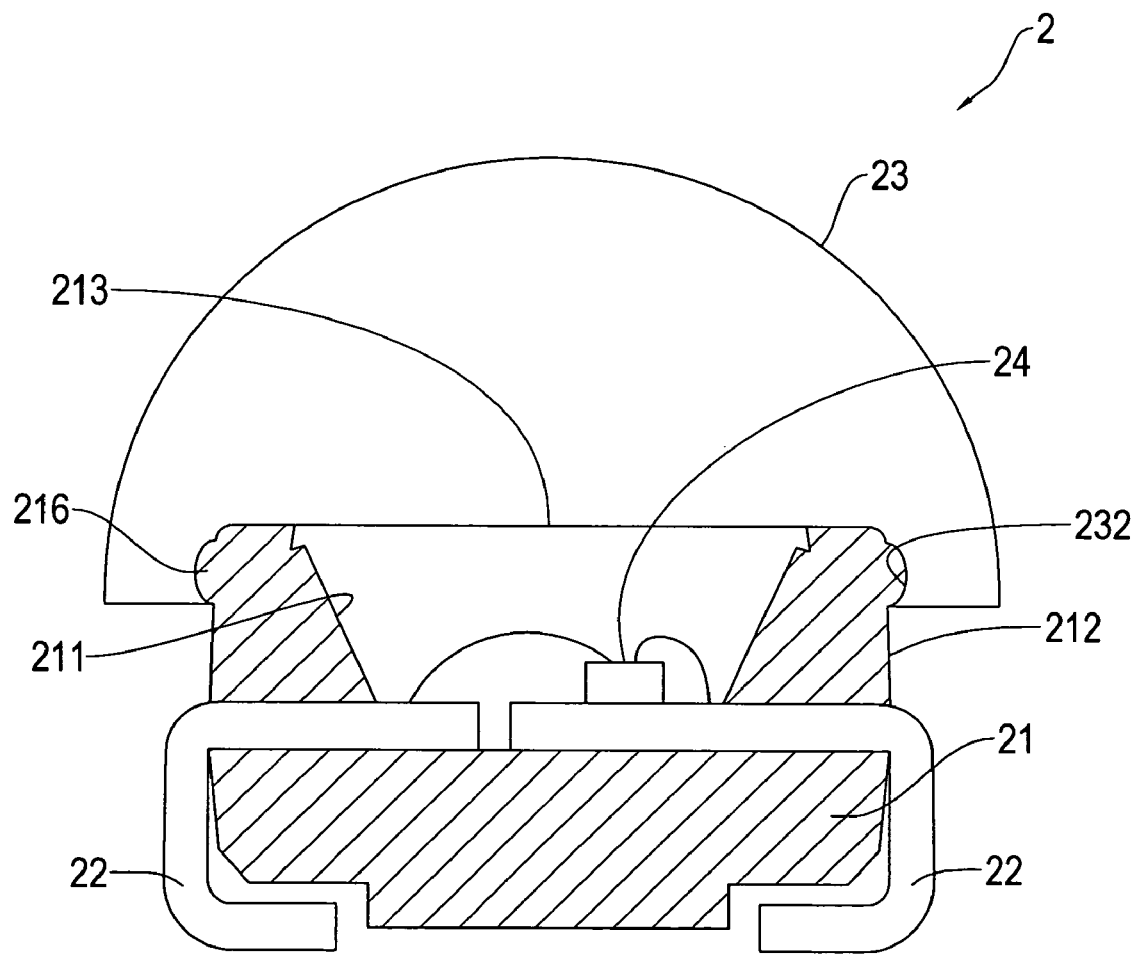
FIG. 4 is a cross-sectional view of a light-emitting diode in accordance with a third embodiment of the present invention.

The present invention provides an improved light-emitting diode, which is for example a light-emitting diode of PLCC (Plastic Leaded Chip Carrier) or SMD (Surface Mount Device) type. Reference is now made to FIGS. 2-4. The light-emitting diode constructed in accordance with the present invention, generally designated at 2, comprises a package body 21, at least a pair of conductive terminals 22, and an optic lens 23. It is noted that FIG. 2 shows a first embodiment of the present invention, FIG. 3 shows a second embodiment of the present invention, and FIG. 4 shows a third embodiment of the present invention.

Description in respect of the first embodiment of the present invention shown in FIG. 2 will now be given. The package body 21 comprises an end surface 213, a circumferential surface 212 that extends from the circumferential surface 212 in a direction perpendicular or generally perpendicular thereto, and a receptacle 211 for accommodating a light-emitting chip 24. The pair of conductive terminals 22 is fixed to the package body 21. The optic lens 23 is mounted to and covers the end surface 213 of the package body 21 to an extent of extending over the circumferential surface 212 of the package body 21, but not reaching any edge of the pair of conductive terminals 22. In the embodiment illustrated, the coverage area of the optic lens 23 does not reach an upper edge of the conductive terminals 22. In this way, the optic lens 23 is formed with a diameter that is obviously greater than the package body 21. The optic lens 23 can be bonded to the package body 21 through resin molding or resin casting.

Description in respect of the second embodiment of the present invention shown in FIG. 3 will now be given, and a difference from the first embodiment is addition of a structure for reinforcing bonding strength, which comprises at least one first interference portion 215 circumferentially formed on the circumferential surface 212 of the package body 21 and at least one second interference portion 231 circumferentially formed on the optic lens 23 at a location adjacent to the circumferential surface 212. The second interference portion 213 corresponds to and interferentially engages the first interference portion 215 to realize positioning and/or fixing, so as to reinforce the bonding strength between the optic lens 23 and the package body 21. The first and second interference portions 215, 231 can be of any desired shape or configuration that interferentially engage, position, fit to, or fix each other. In the second embodiment illustrated in FIG. 3, the first interference portion 215 comprises a recess, while the second interference portion 213 comprises a projection corresponding to and mating the recess. The recess and the projection interferentially engage each other to realize positioning and/or fixing.

Description in respect of the third embodiment of the present invention shown in FIG. 4 will now be given, and a difference from the second embodiment is that the recess and the projection are switched for the first and second interference portions. As shown, the third embodiment of the present invention comprises a first interference portion 216 that is made in the form of a projection, and a second interference portion 232 that is made in the form of a recess corresponding to and mating the projection. The projection and the recess interferentially engage each other to realize positioning and/or fixing.

In addition to the pair of conductive terminals 22, the light-emitting diode 2 of the present invention can comprise a second pair or more pairs of conductive terminals (not shown). Further, although the first and second interference portions 215 (216), 231 (232) of the light-emitting diode 2 of the present invention are made curved and rounded in the examples shown in the drawings, it is possible to shape these portions in any desired form, such as barbed projections and barbed recesses (not shown). The solution of the present invention is also applicable to any light-emitting diodes, which desire to bond optic lens to package body, other than that shown in the drawings.

The improved light-emitting diode 2 in accordance with the present invention features that the optic lens 23 completely covers the end surface 213 of the package body 21 and is even expanded to cover the circumferential surface 212 of the package body 21, so that the bonding strength between the optic lens 23 and the package body 21 is enhanced, and the bonding strength can be further improved by adding first and second interference portions 215 (216), 231 (232) to the optic lens 23 and the package body 21 respectively; that with the optic lens 23 completely covering the end surface 213 of the package body 21 and even expanded to cover the circumferential surface 212 of the package body 21, the diameter of the optic lens 23 is made obviously greater than the package body 21, which significantly improve the optic advantages of the light-emitting diode 2 of the present invention and also makes it possible to expediently make adjustment for a desired optic angle by taking advantage of the optic lens 23 having a sufficiently large diameter; that with the optic lens 23 completely covering the end surface 213 of the package body 21 and even expanded to cover the circumferential surface 212 of the package body 21, overflow of bonding adhesive may only occur on the circumferential surface 212 of the package body 21 and such adhesive overflow is still under the coverage of the optic lens 23 in accordance with the present invention, whereby the conventional problem of bonding adhesive staining conductive terminals due to overflow of the bonding adhesive or the trouble of poor performance of SMT operation due to poor application of tin caused by bonding adhesive staining the conductive terminals can be completely eliminated.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. An improved light-emitting diode, comprising:
a package body having an end surface, a circumferential surface extending from the end surface for a certain distance in a longitudinal direction and extending about a perimeter of the end surface in a direction transverse to the longitudinal direction, and a receptacle formed in the end surface for accommodating a light-emitting chip;
at least one pair of conductive terminals fixed to the package body; and
an optic lens covering the end surface of the package body, the optic lens having a recessed surface bounded by a circumferential edge surface, the recessed surface being disposed in juxtaposition with the end surface of the package body and bonded thereto, the circumferential edge surface being disposed contiguous to the circumferential surface of the package body and bonded thereto.

2. The improved light-emitting diode as claimed in claim 1, wherein the package body includes at least one first interference portion circumferentially formed on the circumferential surface thereof, the optic lens including at least one second interference portion circumferentially formed in the circumferential edge surface of the optic lens and disposed in correspondence to the first interference portion, the first and second interference portions being interferentially engaged and bonded with each other.

3. The improved light-emitting diode as claimed in claim 2, wherein the first interference portion of the package body comprises a recess and the second interference portion of the optic lens comprises a projection corresponding to the recess.

4. The improved light-emitting diode as claimed in claim 2, wherein the first interference portion of the package body comprises a projection and the second interference portion of the optic lens comprises a recess corresponding to the projection.

5. The improved light-emitting diode as claimed in claim 1, wherein the optic lens is bonded to the package body through resin molding or resin casting.

6. The improved light-emitting diode as claimed in claim 1 further comprising plural pairs of conductive terminals.

* * * * *